United States Patent [19]
Bertness

[11] Patent Number: 6,163,156
[45] Date of Patent: Dec. 19, 2000

[54] ELECTRICAL CONNECTION FOR ELECTRONIC BATTERY TESTER

[75] Inventor: Kevin I. Bertness, Batavia, Ill.

[73] Assignee: Midtronics, Inc., Burr Ridge, Ill.

[21] Appl. No.: 09/431,697

[22] Filed: Nov. 1, 1999

[51] Int. Cl.[7] .............................................. G10N 27/416
[52] U.S. Cl. .................................................... 324/426
[58] Field of Search .................... 324/426, 427, 324/430, 433, 445, 446; 320/132, DIG. 21

[56] References Cited

U.S. PATENT DOCUMENTS

| | | | |
|---|---|---|---|
| 2,514,745 | 7/1950 | Dalzell | 171/95 |
| 3,356,936 | 12/1967 | Smith | 324/29.5 |
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Strezelewicz | 324/170 |
| 3,873,911 | 3/1975 | Champlin | 324/29.5 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 324/29.5 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |

(List continued on next page.)

FOREIGN PATENT DOCUMENTS

| | | |
|---|---|---|
| 0 022 450 A1 | 1/1981 | European Pat. Off. . |
| 0 637 754 A1 | 2/1995 | European Pat. Off. . |
| 0 772 056 A1 | 5/1997 | European Pat. Off. . |
| 29 26 716 B1 | 1/1981 | Germany . |
| 59-017894 | 1/1984 | Japan . |
| 59-17892 | 1/1984 | Japan . |
| 59-17893 | 1/1984 | Japan . |
| 59-17894 | 1/1984 | Japan . |
| 60-225078 | 11/1985 | Japan . |
| 03274479 | 12/1991 | Japan . |
| 03282276 | 12/1991 | Japan . |
| 04131779 | 5/1992 | Japan . |
| 04372536 | 12/1992 | Japan . |
| 5216550 | 8/1993 | Japan . |
| 2 088 159 | 6/1982 | United Kingdom . |
| WO 93/22666 | 11/1993 | WIPO . |
| WO 98/58270 | 12/1998 | WIPO . |

OTHER PUBLICATIONS

"Electrochemical Impedance Spectroscopy in Battery Development and Testing", *Batteries International*, Apr. 1997, pp. 59 and 62–63.

(List continued on next page.)

*Primary Examiner*—Edward H. Tso
*Attorney, Agent, or Firm*—Westman, Champlin & Kelly, P.A.

[57] ABSTRACT

An electronic battery tester for testing a storage battery while the storage battery is coupled to a wiring system includes a first electrical probe configured to physically and electrically couple to a positive terminal of the storage battery, a second electrical probe configured to physically and electrically couple to a negative terminal of the storage battery, a third electrical probe configured to electrically couple to the positive terminal of the storage battery at a physically remote location from the storage battery, and a fourth electrical probe configured to electrically couple to the negative terminal of the storage battery at a physically remote location from the storage battery. Battery test circuitry couples to the first, second, third and fourth probes and performs a battery test on the storage battery using the first, second, third and fourth probes in a Kelvin connection configuration and responsively provides a battery test output.

20 Claims, 2 Drawing Sheets

OTHER PUBLICATIONS

| | | | |
|---|---|---|---|
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,390,828 | 6/1983 | Converse et al. | 320/32 |
| 4,392,101 | 7/1983 | Saar et al. | 320/20 |
| 4,396,880 | 8/1983 | Windebank | 320/21 |
| 4,408,157 | 10/1983 | Beaubien | 324/62 |
| 4,412,169 | 10/1983 | Dell'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,816,768 | 3/1989 | Champlin | 324/428 |
| 4,820,966 | 4/1989 | Fridman | 320/32 |
| 4,825,170 | 4/1989 | Champlin | 324/436 |
| 4,849,700 | 7/1989 | Morioka et al. | 324/427 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,931,738 | 6/1990 | MacIntyre et al. | 324/435 |
| 4,947,124 | 8/1990 | Hauser | 324/430 |
| 4,956,597 | 9/1990 | Heavey et al. | 320/14 |
| 4,968,941 | 11/1990 | Rogers | 324/428 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,248 | 9/1992 | Alexandres et al. | 324/428 |
| 5,170,124 | 12/1992 | Blair et al. | 324/434 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/15 |
| 5,302,902 | 4/1994 | Groehl | 324/434 |
| 5,331,268 | 7/1994 | Patino et al. | 320/20 |
| 5,336,993 | 8/1994 | Thomas et al. | 324/158.1 |
| 5,343,380 | 8/1994 | Champlin | 363/46 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,426,371 | 6/1995 | Salley et al. | 324/429 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Matsumoto et al. | 320/20 |
| 5,449,997 | 9/1995 | Gilmore et al. | 320/39 |
| 5,457,377 | 10/1995 | Jonsson | 320/5 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,585,728 | 12/1996 | Champlin | 324/427 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |
| 5,650,937 | 7/1997 | Bounaga | 364/483 |
| 5,652,501 | 7/1997 | McClure et al. | 320/17 |
| 5,675,234 | 10/1997 | Greene | 320/15 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,717,336 | 2/1998 | Basell et al. | 324/430 |
| 5,757,192 | 5/1998 | McShane et al. | 324/427 |
| 5,773,978 | 6/1998 | Becker | 324/430 |
| 5,789,899 | 8/1998 | van Phuoc et al. | 320/30 |
| 5,793,359 | 8/1998 | Ushikubo | 345/169 |
| 5,821,756 | 10/1998 | McShane et al. | 324/430 |
| 5,831,435 | 11/1998 | Troy | 324/426 |
| 5,872,443 | 2/1999 | Williamson | 320/21 |
| 5,914,605 | 6/1999 | Bertness | 324/430 |
| 5,945,829 | 8/1999 | Bertness | 324/430 |

OTHER PUBLICATIONS

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

ELECTRICAL CONNECTION FOR ELECTRONIC BATTERY TESTER

BACKGROUND OF THE INVENTION

The present invention relates to electronic battery testers. More specifically, the present invention relates to the electrical connection or probes used by such battery testers to couple to storage batteries.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin and Midtronics, Inc. of Burr Ridge, Ill. for testing storage batteries by measuring the conductance of the batteries. This technique is described in a number of United States patents for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098; issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; and U.S. Pat. No. 5,914,605, issued Jun. 22, 1999, entitled ELECTRONIC BATTERY TESTER.

Many such advanced battery testing techniques require Kelvin connections to couple to the storage battery. With a Kelvin connection, the battery and test includes two electrical connections or probes for each terminal of the battery. A first pair of probes (one on the positive terminal of the battery and one on the negative terminal) is used to inject a signal or apply a forcing function to the battery. A second pair of probes (one on the positive terminal of the battery and one on the negative of the terminal) is used to sense the resulting response in the battery. The Kelvin connections for an individual terminal are typically carried in a single clip of the battery tester, one connector in each side of the clip. The Kelvin connections are placed in direct physical contact with the terminal of the battery. The use of Kelvin connections is useful in reducing errors due to resistance in the electrical path of the battery tester and measurements. Such errors can lead to inaccurate results in the battery test, particularly in battery testers which utilize resistance, impedance, conductance or admittance measurements for the battery test.

An additional problem arises with traditional Kelvin connectors when the battery is positioned with the terminal inaccessible. For example, in some vehicles only battery charging terminals are easily accessible. The battery itself is positioned remotely, and electrical connectors are used to charge the battery are brought out to a more accessible location. When traditional Kelvin probes are used to couple to the battery charging terminals, an error is introduced into the measurements due to the resistance of the electrical cables which connect the charging terminals to the battery.

SUMMARY OF THE INVENTION

An electronic battery tester for testing a storage battery while the storage battery is coupled to a wiring system includes a first electrical probe configured to electrically couple to a positive terminal of the storage battery and a second electrical probe configured to electrically couple to a negative terminal of the storage battery. A third electrical probe configured to electrically couple to the positive terminal of the storage battery and a fourth electrical probe is also configured to electrically couple to the negative terminal of the storage battery. Battery test circuitry coupled to the first, second, third and fourth probes and performs a battery test on the storage battery using the first, second, third and fourth probes in a Kelvin connection configuration and responsively provides a battery test output. At least one of the probes is adapted to couple to the battery at a physically remote location.

DETAILED DESCRIPTION OF THE ILLUSTRATIVE EMBODIMENTS

The present invention provides a battery tester with a modified Kelvin connection technique. Typical prior art battery testers use Kelvin connections which directly, physically couple to the terminals of the battery. One source of error can arise if the terminal of the battery is corroded. This corrosion introduces an electrical resistance in the path of a forcing function which is applied to the battery. This can lead to measurement errors. Another source of errors with such Kelvin connections can be due to any extraneous currents flowing into or out of the battery through parallel signal paths. For example, such paths exist in the electrical wiring system of an automotive vehicle. Extraneous current can flow through the alternator, and various electrical devices such as the radio and computer system.

In the present invention, a modified Kelvin connection is provided in which the pair of electrical connections or probes which are used to apply the forcing function to the battery are located at a physically remote location, spaced apart from the battery and coupled to the battery through the wiring system to which the battery is connected. In one aspect, at least one of the probes (although up to all four probes can be) located remotely from the battery. Generally, the electrical connection between the battery and a remote probe does not carry both a current and a voltage signal. In one aspect, the sensing pair of terminals of the Kelvin connection are positioned physically proximate the terminals of the battery. The forcing function is applied to the battery using the remote pair of probes and the resulting response can be observed using the probes which are physically coupled to the battery. In one aspect, at least one of the probes electrically couples to the battery at a physically remote location from the battery.

When implemented in an portable battery tester, four separate probes can be used. One pair of probes directly (physically) coupling to the terminals of the battery and one pair of probes electrically coupling to battery through a physically remote location using the electrical wiring system of an automotive vehicle. This is useful in eliminating problems associated with corrosion on the terminals of the battery. If a permanently mounted battery tester is used in, for example, an automotive vehicle, the probes can be permanently mounted and are useful in removing the influence of any parallel impedance paths due to the alternator or vehicle loads.

Figure 1:
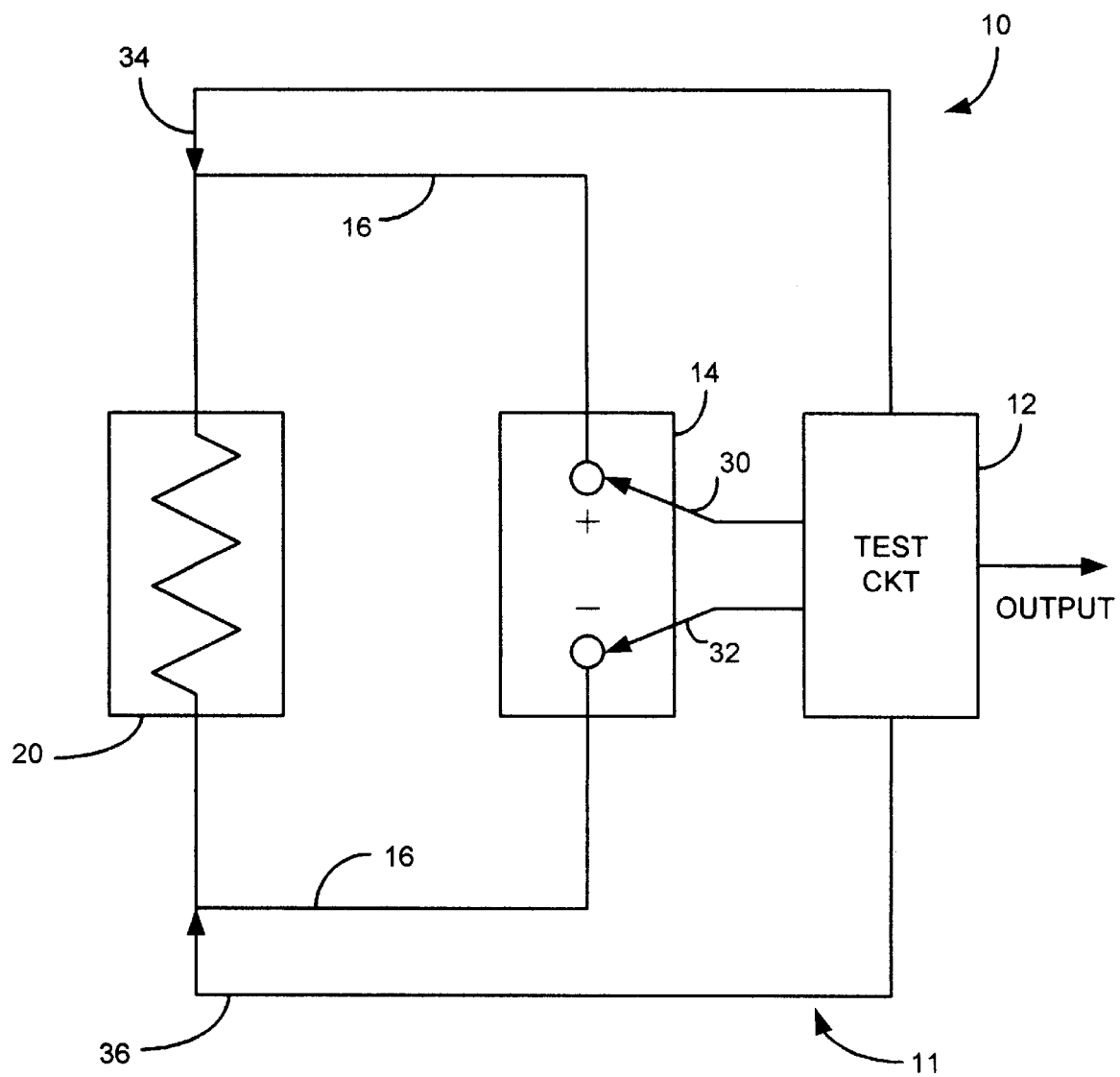
FIG. 1 is a simplified block diagram showing a battery test circuit configured to connect to a storage battery in accordance with one embodiment of the present invention.

FIG. 1 is a simplified block diagram 10 showing an electronic battery tester 11 including a test circuit 12 coupled to a storage battery 14. As illustrated in FIG. 1, battery 14 also couples to an electrical wiring system 16. Wiring system 16 can be, for example, the wiring system of an automotive vehicle. Wiring system 16 couples battery 14 to parallel current paths which are illustrated generally as resistance 20. For example, these current paths can be through alternators or electrical devices in an automotive vehicle such as the automotive vehicle radio or computer system.

Battery test circuit 12 couples to battery 14 using electrical connections or probes 30,32,34 and 36. Probes 30 and 32 couple directly (physically) to the positive and negative terminals, respectively of battery 14. Probes 34 and 36 electrically couple to battery 14 through wiring system 16. However, probes 34 and 36 are located at a physically remote location from the battery 14. As used herein, the physically remote location can be anything that is not directly connected to the terminals of the battery 14. In another definition, a physically remote location is any location which is spaced apart from the attachment lugs of battery. Probes 30–36 can comprise, for example, clips or clamps that can be selectively coupled to the positive and negative battery terminals (clamps 30,32) or to portions of a wiring system for a vehicle such as electrical ground (clamp 36) or a lug on an alternator (clamp 34).

During operation, a forcing function is applied to battery 14 by test circuit 12 using probes 34 and 36. The resultant response is measured directly at battery 14 using probes 30 and 32. Test circuitry 12 uses this data to determine the condition of the battery and can responsively provide an output indicative of this condition. For example, test circuitry 12 can determine the internal resistance, conductance, impedance or admittance of battery 14 and based upon this determination can provide information regarding the condition of battery 14. Such techniques are shown, for example, in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; and U.S. Pat. No. 5,914,605, issued Jun. 22, 1999, entitled ELECTRONIC BATTERY TESTER which are incorporated herein by reference.

Figure 2:
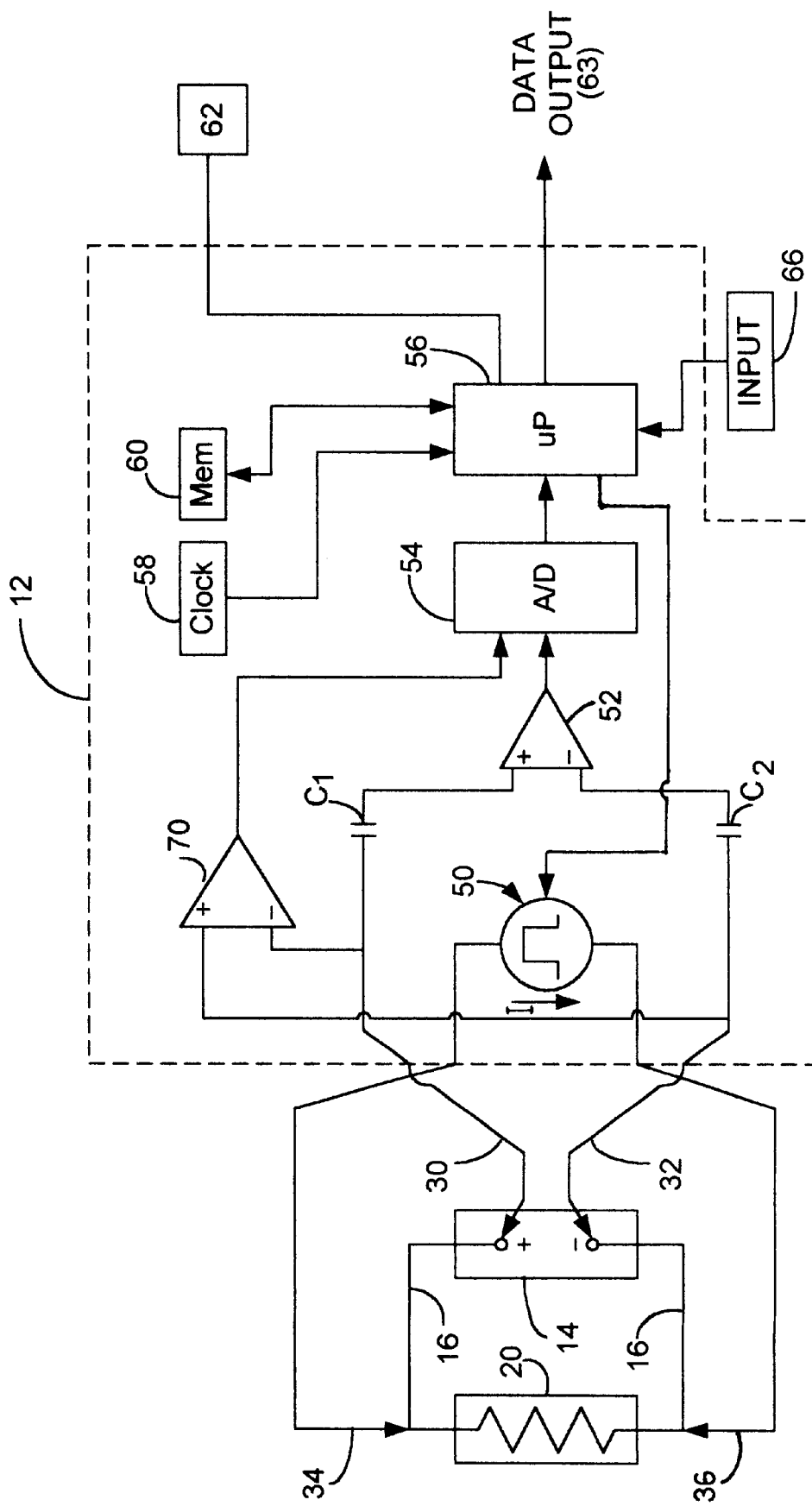
FIG. 2 is a simplified schematic diagram showing a more detailed embodiment of the test circuitry of FIG. 1.

FIG. 2 is a more detailed diagram showing one example embodiment of test circuitry 12. Circuitry 12 operates in accordance with one embodiment of the present invention and determines the conductance ($G_{BAT}$) of battery 14 and the voltage potential ($V_{BAT}$) between positive and negative terminals of battery 14. Circuitry 12 includes current source 50, differential amplifier 52, analog-to-digital converter 54 and microprocessor 56. Amplifier 52 is capacitively coupled to battery 14 through capacitors $C_1$ and $C_2$. Amplifier 52 has an output connected to an input of analog-to-digital converter 54. Microprocessor 56 is connected to system clock 58, memory 60, display output 62 and analog-to-digital converter 54 and an optical data output 63. Microprocessor 56 is also capable of receiving an input from input device 66. Device 66 can be used to control test circuitry 12 or provide reference data for use in testing.

In operation, current source 50 is controlled by microprocessor 56 and provides a current in the direction shown by the arrow in FIG. 2. In one embodiment, this is a square wave or a pulse. Differential amplifier 52 is connected to the positive and negative terminals of battery 14 through probes 30 and 32 and capacitors $C_1$ and $C_2$, respectively, and provides an output related to the voltage potential difference between probes 30 and 32. In a preferred embodiment, amplifier 52 has a high input impedance. Circuitry 12 includes differential amplifier 70 having inverting and non-inverting inputs connected to probes 30 and 32, respectively. Amplifier 70 is connected to measure the open circuit potential voltage ($V_{BAT}$) of battery 14. The output of amplifier 70 is provided to analog-to-digital converter 54 such that the voltage across probes 30 and 32 can be measured by microprocessor 56.

Circuitry 12 is connected to battery 14 through the modified four-point connection technique in accordance with the present invention. This modified Kelvin connection allows current I to be injected into battery 14 through probes 34 and 36 while the voltage V across the probes 20 and 32 is measured. Because very little current flows through amplifier 52, the voltage drop across the inputs to amplifier 52 is substantially identical to the voltage drop across probes 30 and 32 and the positive and negative terminals of battery 14. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 14 by applying a current pulse I using current source 50. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 14. Microprocessor 56 calculates the conductance of battery 12 using the following equation:

$$\text{Conductance}=G_{BAT}=\Delta I/\Delta V \qquad \text{Equation 1}$$

where $\Delta I$ is the change in current flowing through battery 12 due to current source 50 and $\Delta V$ is the change in battery voltage due to applied current $\Delta I$. However, resistance, impedance, or admittance can also be employed. In one embodiment, the output relates to cold cranking amps (CCA) of the battery. In general, microprocessor 56 determines a dynamic parameter of battery 12 using a forcing function having an AC component through one pair of connections and monitoring the resulting AC response signal through a second pair of components.

Although the present invention has been described with reference to preferred embodiments, workers skilled in the art will recognize that changes may be made in form and detail without departing from the spirit and scope of the invention. The particular physical implementation of the connectors can be charged as desired. Further, any type of test circuitry can be used and the circuitry is not limited to the particular embodiments set forth herein.

What is claimed is:

1. An electronic battery tester for testing a storage battery while the storage battery is coupled to an electrical wiring system, comprising:

a first electrical probe configured to electrically couple to a positive terminal of the storage battery;

a second electrical probe configured to electrically couple to a negative terminal of the storage battery;

a third electrical probe configured to electrically couple to the positive terminal of the storage battery;

a fourth electrical probe configured to electrically couple to the negative terminal of the storage battery;

battery test circuitry coupled to the first, second, third and fourth probes and configured to perform a battery test on the storage battery as a function of a current through the first and second probes and as a function of a voltage between the third and fourth probes and responsively provide a battery test output;

wherein at least one of the probes is adapted to electrically couple to the battery at a physically remote location from the storage battery.

2. The electronic battery tester of claim 1 wherein the battery test output is a function of a voltage measured between the first and second probes.

3. The electronic battery tester of claim 1 wherein the battery test output is a function of a forcing function applied between the third and fourth probes.

4. The electronic battery tester of claim 3 wherein the forcing function comprises a current signal.

5. The electronic battery tester of claim 3 wherein the forcing function comprises a voltage signal.

6. The electronic battery tester of claim 3 wherein the forcing function is provided through application of a resistive load.

7. The electronic battery tester of claim 6 wherein the electrical load comprises a resistive load.

8. The electronic battery tester of claim 1 wherein the electrical wiring system comprises an automotive vehicle wiring system.

9. The electronic battery tester of claim 1 wherein the battery test output is related to battery conductance.

10. The electronic battery tester of claim 1 wherein the battery test output is related to battery resistance.

11. The electronic battery tester of claim 1 wherein the battery test output is related to battery admittance.

12. The electronic battery tester of claim 1 wherein the battery test output is related to battery impedance.

13. The electronic battery tester of claim 1 wherein the battery test output is a function of a voltage between the first and second probes and a current through the third and fourth probes.

14. The electronic battery tester of claim 10 wherein an electrical connection between the at least one probe at the physically remote location and the battery carries only the current through the third and fourth probes.

15. The electronic battery tester of claim 10 wherein an electrical connection between the at least one probe at the physically remote location and the battery carries only the voltage between the first and second probes.

16. The electronic battery tester of claim 1 wherein the battery tester comprises a portable battery tester.

17. The electronic battery tester of claim 1 wherein the battery test output is a function of battery resistance.

18. The electronic battery tester of claim 1 wherein the battery test output is a function of battery conductance.

19. The electronic battery tester of claim 1 wherein the battery test output is a function of battery impedance.

20. The electronic battery tester of claim 1 wherein the battery test output is a function of battery admittance.

* * * * *